(12) United States Patent
Saitou et al.

(10) Patent No.: US 7,219,025 B2
(45) Date of Patent: May 15, 2007

(54) WAVEFORM MEASURING INSTRUMENT USING INTERPOLATED DATA

(75) Inventors: Takuya Saitou, Musashino (JP); Shigeru Takezawa, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 485 days.

(21) Appl. No.: 10/318,196

(22) Filed: Dec. 13, 2002

(65) Prior Publication Data
US 2003/0115003 A1  Jun. 19, 2003

(30) Foreign Application Priority Data
Dec. 18, 2001 (JP) .............................. 2001-384351

(51) Int. Cl.
*G06F 19/00* (2006.01)
(52) U.S. Cl. ...................................................... 702/66
(58) Field of Classification Search .................. 702/66, 702/67, 70, 75, 80, 189, 199; 356/5.01, 5.04, 356/5.09; 600/447
See application file for complete search history.

(56) References Cited

U.S. PATENT DOCUMENTS
5,902,244 A * 5/1999 Kobayashi et al. ......... 600/447

FOREIGN PATENT DOCUMENTS
JP  8-173431  7/1996
JP  08-173431 * 7/1996

* cited by examiner

*Primary Examiner*—Bryan Bui
(74) *Attorney, Agent, or Firm*—Westerman, Hattori, Daniels & Adrian, LLP

(57) ABSTRACT

The present invention is intended to provide a waveform measuring instrument which can carry out signal processing and waveform parameter measurement with high accuracy and at high resolution.

In a waveform measuring instrument configured to write measured signal waveforms into a memory after converting the waveforms to digital data, the present invention is characterized by providing an interpolation system which performs interpolation between the above digital data and writing the data obtained after interpolation into the above memory.

8 Claims, 5 Drawing Sheets

○ : 1st sampled data
✕ : 2nd sampled data
△ : Averaged data of 1st and 2sampled data (Averaged as same timing)

WAVEFORM MEASURING INSTRUMENT USING INTERPOLATED DATA

BACKGROUND OF THE INVENTION

1. Field of the Invention

The present invention relates to the improvement of waveform data processing in waveform measuring instruments using interpolated data, such as digital oscilloscopes.

2. Description of the Prior Art

The digital oscilloscope, which is a typical waveform measuring instrument, converts a time-series continuous signal waveform into digital data with an A/D converter, records them on a memory discretely, and displays the data recorded in the memory as waveforms.

If the sampling rate of the A/D converter is sufficiently high compared with the resolution of the display, signal waveforms can be reproduced by displaying only the points corresponding to these discrete data. However, the sampling rate is a finite value and so if the display resolution in the direction of the time base called T/div is expanded, the sampling rate is decreased relative to the resolution of the display and thus it becomes difficult to distinguish the signal waveforms from the reproduced display image.

In order to compensate for such relative decrease of sampling rate, a function for displaying waveforms by interpolating data between sampled data is provided. This function enables a waveform closer to the true signal waveform to be distinguished from the reproduced display image of an oscilloscope.

FIG. 1 is a block diagram showing an example of such conventional digital oscilloscopes.

Pre-amplifier 1 comprises the attenuation circuit and the pre-amplifier and adjusts the amplitude of input signals so that they come into an appropriate range for the input specifications of A/D converter (hereafter called "ADC") 2 to output them to ADC 2.

ADC 2 converts input signals input from pre-amplifier 1 to digital data and outputs them to primary data processor 3.

Primary data processor 3 writes the digital data input from ADC 2 into primary memory 4 which functions as a buffer memory with a sampling rate meeting the time base setting. The data written in primary memory 4 are read by acquisition data processor 5 via primary data processor 3.

Acquisition data processor 5 writes the data read from primary memory 4 into acquisition memory 6 as well as applies averaging and addition, subtraction and multiplication or the like between two or more waveforms to the data read from acquisition memory 6. In addition, automatic measurement of waveform parameters, reading of values on waveforms by specifying with the cursor, or the like are also carried out in this acquisition data processor 5.

In display processing of the data written in acquisition memory 6, the data written in acquisition memory 6 are read by interpolation system 7 via acquisition data processor 5 and interpolation processing is carried out for the read data.

The data subjected to interpolation processing are input to display processor 8. Display processor 8 writes the display data into display memory 9 as well as outputs the display data in display memory 9 to display 10, such as a LCD, CRT, printer, or the like.

As described above, digital oscilloscopes not only display sampled data as waveforms but also have additional functions including a signal processing function such as averaging and an automatic waveform parameter measuring function. In conventional digital oscilloscopes as shown in FIG. 1, these functions are performed based on the sampled data.

FIG. 2 is a drawing illustrating automatic measurement of period in the configuration shown in FIG. 1. For automatic measurement of period, it is necessary to measure the time interval from point A where the waveform crosses the base line in one direction to point B where the waveform crosses the base line next time in the same direction as at point A. However, the data actually sampled and acquired in acquisition memory 6 are those for 14 points during two periods.

Although the number of data is less for the resolution of a display, sampling is done the number of times equal to or more than the Nyquist rate for the waveform frequency. Thus, a waveform is displayed on the screen equivalent to the original waveform such as that drawn with a continuous line if appropriate interpolation is carried out.

However, since values narrower than the time interval between actual adjacent sample points cannot be measured in measurements based on the acquisition data in the configuration of conventional digital oscilloscopes as shown in FIG. 1, an error occurs for the period Tm measured in the automatic parameter measurement against the original period Tr, as shown in FIG. 2.

FIG. 3 is a drawing illustrating noise rejection using averaging. If the number of sampling data points is less for the resolution of a display, the following problem occurs:

Consider a case where noise superimposed on signal waveforms shown with a broken line in FIG. 3 is to be rejected by averaging. It is assumed that points "○" on the waveform shown with a broken line represent the data obtained by the first acquisition and points "X" represent the data obtained by the second acquisition. For two or more acquisitions, the sampling points in each time sampling have time-shifts relative to each other.

However, in the conventional configuration shown in an example of conventional digital oscilloscopes in FIG. 1, since sampled data at corresponding sampling points in each time acquisition are averaged as the data at the same instant respectively, the averaged waveform shows the waveform represented by symbols "Δ" and the continuous line in FIG. 3. This enables noise rejection to be performed. However, there is a problem that the frequency characteristic degrades in a high frequency region close to the Nyquist rate.

SUMMARY OF THE INVENTION

The present invention is intended to solve these problems with the objective of providing waveform measuring instruments which can process signals or measure waveform parameters with high resolution and high accuracy.

In order to achieve this objective, the present invention is characterized by providing an interpolation system which interpolates between digital data and writing the data obtained after interpolation into the memory, in waveform measuring instruments that are configured so that the measured signal waveform is converted to digital data and then those data are written into the memory.

This enables the interpolated data to be handled in the same manner as the digital data obtained by converting the measured signal waveform.

DESCRIPTION OF THE PREFERRED EMBODIMENTS

An embodiment of the present invention will be described below with reference to the drawings.

First Embodiment

Figure 1:
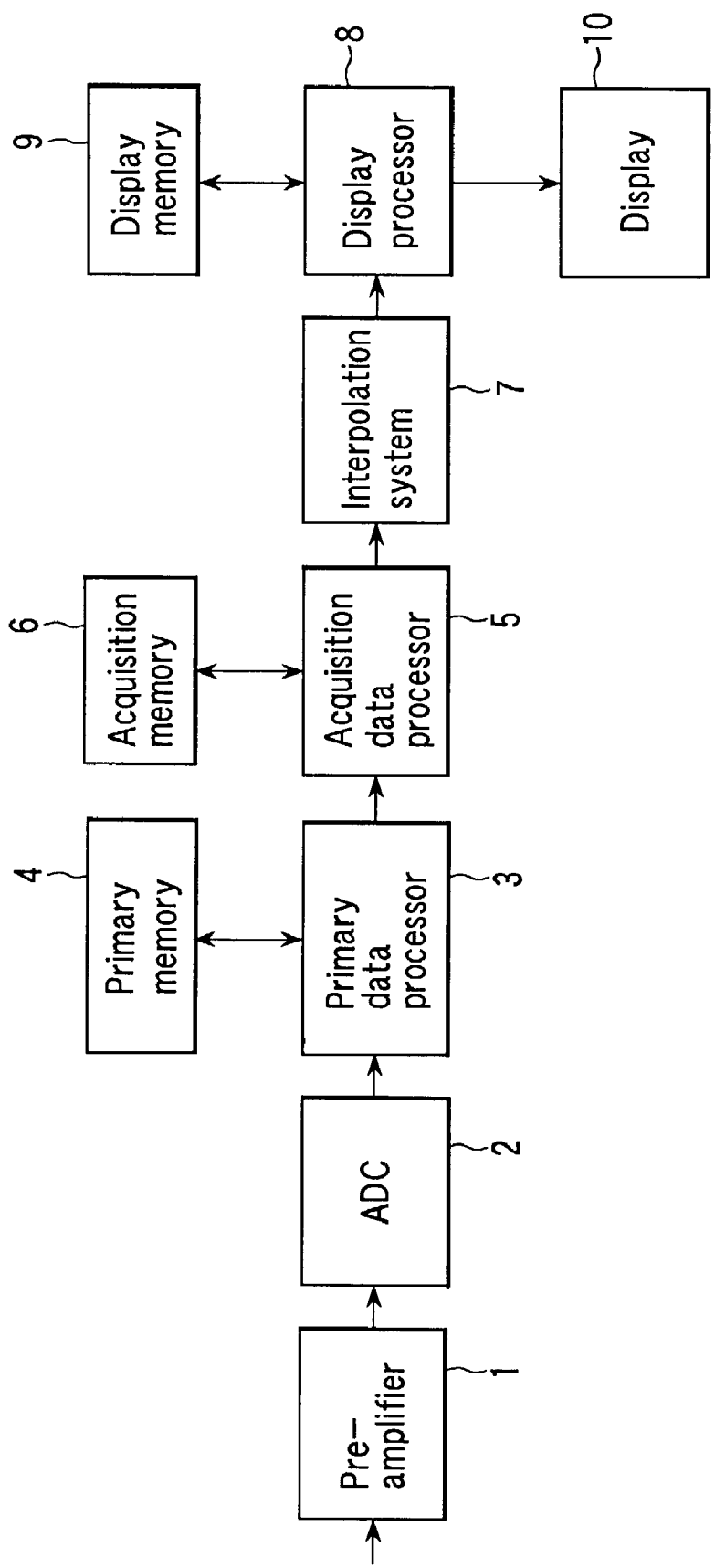
FIG. 1 is a block diagram showing an example of conventional waveform measuring instruments.
Figure 2:
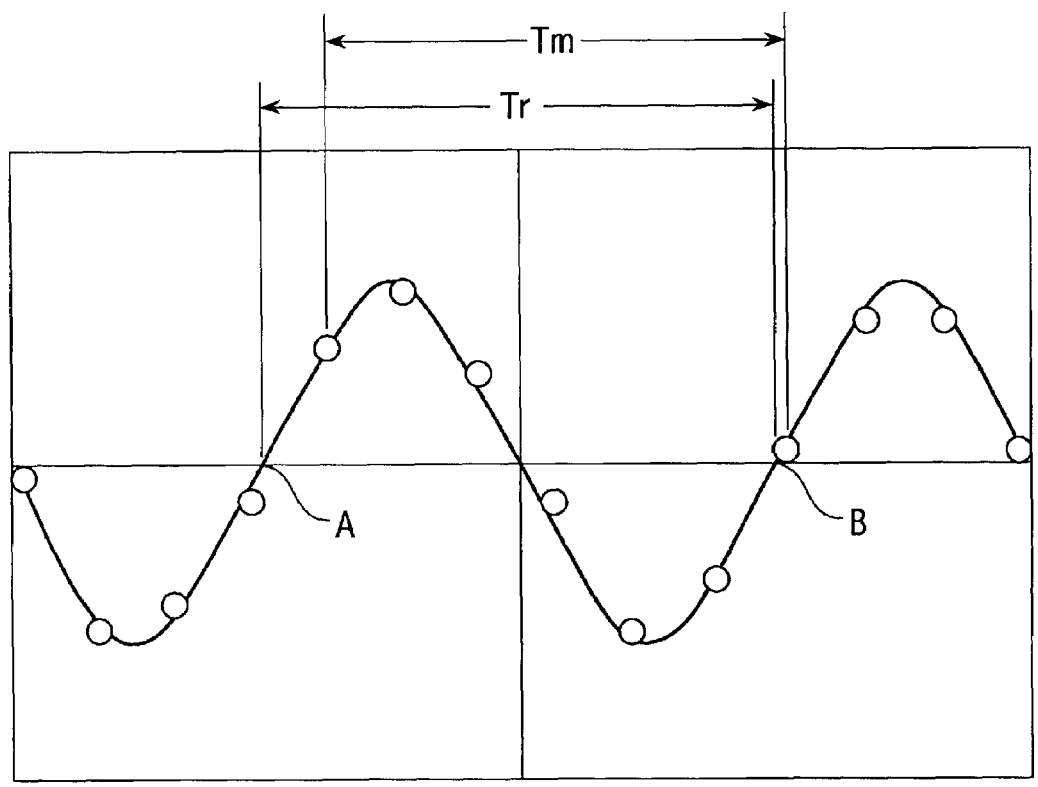
FIG. 2 is a drawing illustrating automatic measurement of the period.
Figure 3:
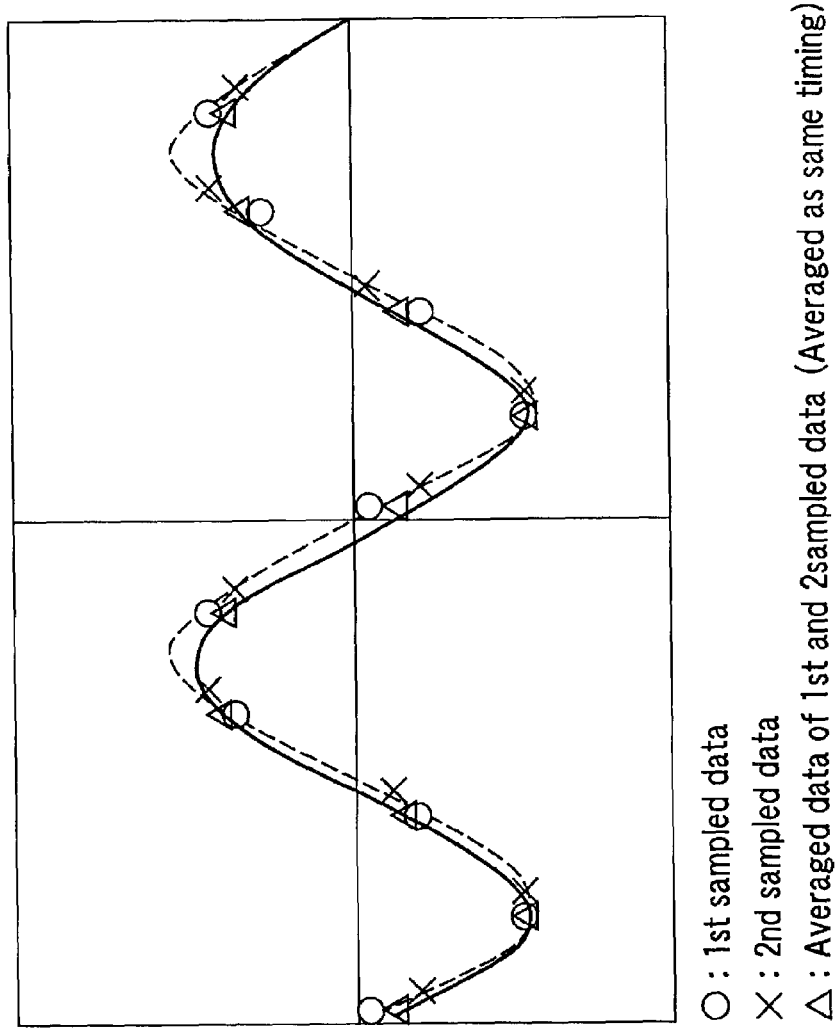
FIG. 3 is a drawing illustrating a conventional averaging waveform.
Figure 4:
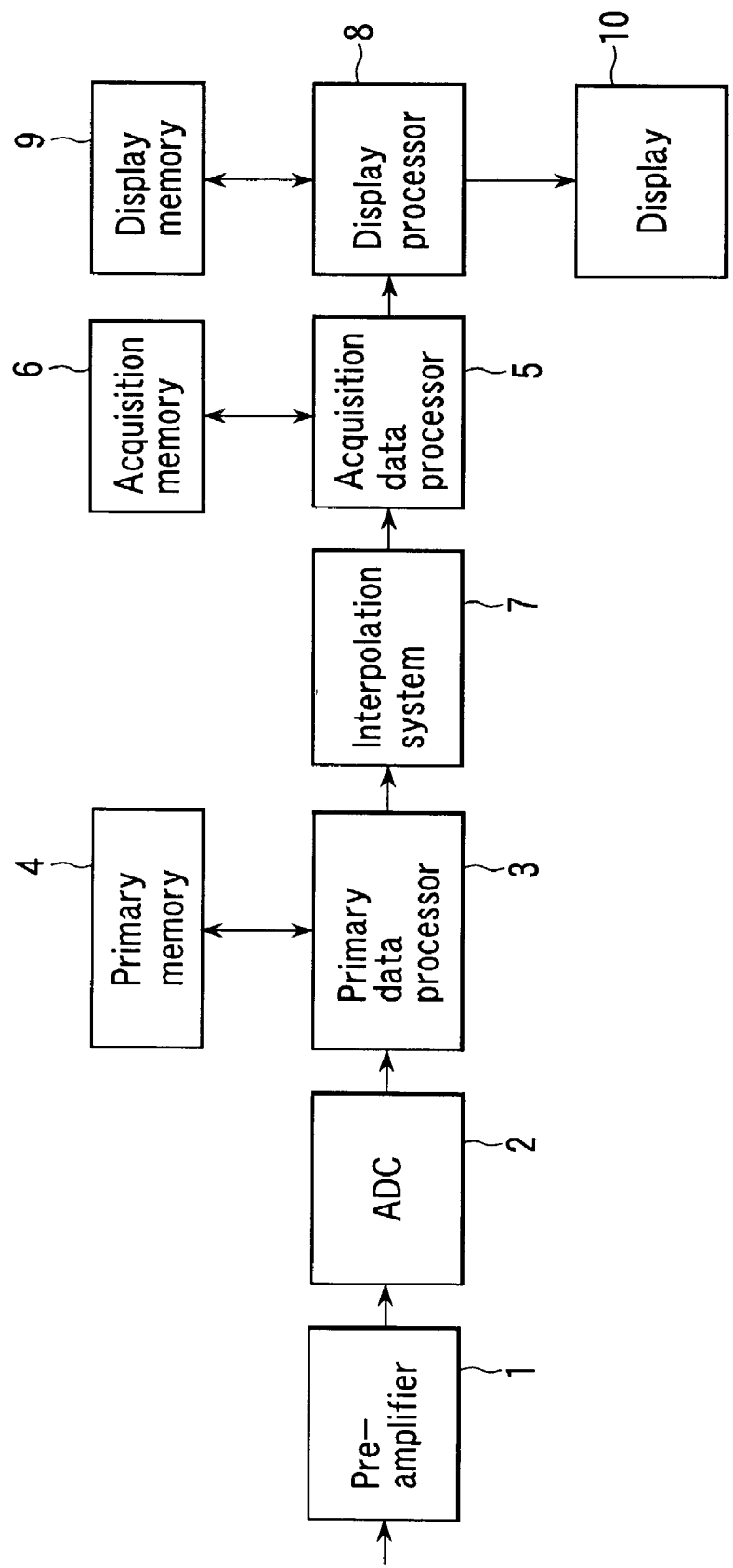
FIG. 4 is a block diagram showing an embodiment of the present invention.

FIG. 4 is a block diagram for a waveform measuring instrument showing an embodiment of the present invention, and the parts common to those in FIG. 1 are given the same signs. The difference of FIG. 4 from FIG. 1 is the position of connection of interpolation system 7. That is, in FIG. 4, interpolation system 7 is connected between primary data processor 3 and acquisition data processor 5. To acquisition memory 6, the data obtained after interpolation processing in interpolation system 7 are written via acquisition data processor 5. In addition, circuits that have been used to date, for example, may be used as interpolation system 7.

In this case, the time resolution by interpolation is not limited by the display resolution but is set up so that sufficient resolution to improve the accuracy of the waveform parameters and calculating operation between waveforms can be obtained.

The data written in acquisition memory 6 after interpolation are those obtained by inserting the interpolated data with interpolation system 7 into the digital data to which the measured signal waveform is converted with ADC 2. This enables acquisition data processor 5 to handle equally both digital data to which the measured signal waveform is converted and the interpolated data. Acquisition data processor 5 carries out moving average processing, addition, subtraction and multiplication among a plurality of waveforms, automatic measurement of waveform parameters, reading of the values on the waveform by specifying with the cursor, or the like for the data obtained after interpolation written in acquisition memory 6, similar to those in conventional measuring instruments.

In the meantime, considering acquisition memory 6, the memory requires an extraordinarily large memory capacity compared with the case where only the digital data to which the measured signal waveform is converted are written because the data obtained after interpolation are also written.

Further, considering acquisition data processor 5, a high speed calculation processing function for a vast amount of data is required for this processor, because the processor must control the reading and writing of the data for large capacity acquisition memory 6, and must perform various types of signal processing and calculation processing for a large amount of measured data read from acquisition memory 6.

Memories used as acquisition memory 6 in conventional waveform measuring instruments have relatively small storage capacities with a memory component only and thus a relatively large mounting space is required in order to make a very large capacity available. It has therefore been considered difficult to obtain a very large capacity for acquisition memory 6.

In addition, as acquisition data processor 5, it has also been difficult to obtain a calculating device suitable for enabling a very large amount of data to be processed at a high speed.

However, rapid progress in the production of a large capacity semiconductor memories and high-speed calculating devices in recent years has led to large capacity acquisition memory 6 becoming available and has enabled acquisition data processor 5 to handle a very large amount of data at high speed.

As described above, the apparent resolution in the direction of the time base is improved by handling the interpolated data and actually sampled data in the same manner. As a result, it is possible to perform signal processing and automatic measurement of waveform parameters, reading of waveform parameters specified with a cursor, and the like with high accuracy and at high resolution.

Further, according to the present invention, intensity modulation for waveform display in digital oscilloscopes can also be realized.

Analog oscilloscopes have a characteristic in which traces on the screen appear dim in the portions where waveform changes are large, and appear bright in the portions where waveform changes are small.

In the present invention, data also exist between actual sampling points due to the insertion of interpolated data. This makes it possible to determine the appearance frequencies of values close to each voltage value of each data point in the vicinity of each data point respectively for waveform data obtained after interpolation including interpolated data. In the configuration for conventional digital oscilloscopes shown in FIG. 1, it has been difficult to determine the appearance frequencies because the number of data on the display decreases if the time base is expanded.

The fact that appearance frequencies can be determined enables each data point to be displayed on the screen with respective brightness corresponding to each appearance frequency. Traces on the screen can be displayed bright in the portions where waveform changes are small and dim in the portions where waveform changes are large by applying processing as described above and this makes it possible to obtain waveform displays very close to the waveform display characteristic of analog oscilloscopes.

Second Embodiment

Figure 5:
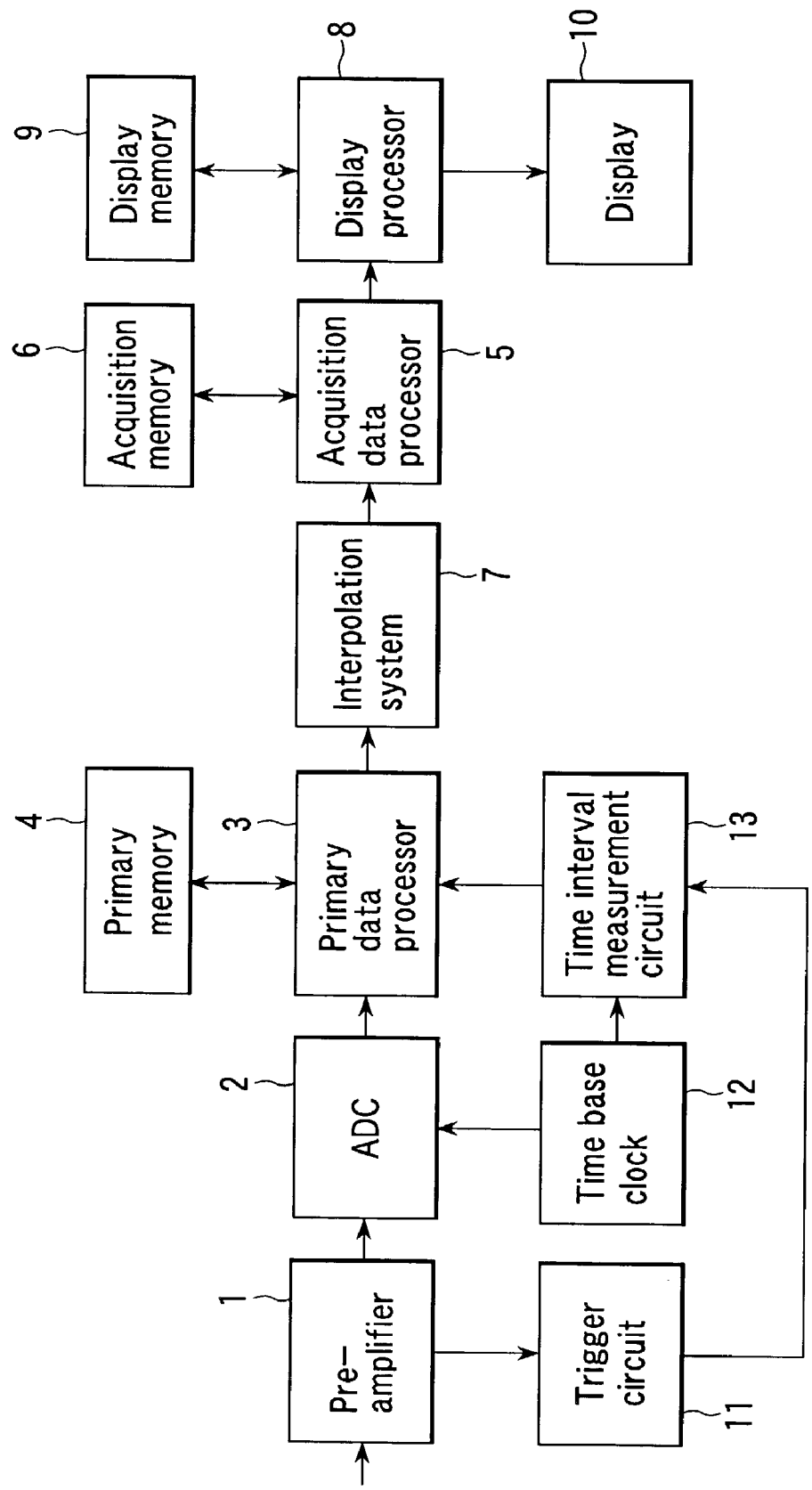
FIG. 5 is a block diagram showing another embodiment of the present invention.

FIG. 5 is a block diagram showing another embodiment of the present invention and the parts common to those in FIG. 4 are given the same signs. In FIG. 5, trigger circuit 11, time base clock 12, and time interval measurement circuit 13 are provided in addition to the configuration shown in FIG. 4 to add a function for measuring the time difference between the time base and the trigger.

The circuit configuration shown in FIG. 5 is also effective for noise rejection using averaging.

In the system shown in FIG. 5, averaging is done by applying the time difference correction to the data whose time resolution is improved by the interpolated data. The time difference between the time base and the trigger is measured by time interval measurement circuit 13 after inputting output signals from trigger circuit 11 and time base clock 12 to time interval measurement circuit 13. Based on the result of measurement in time interval measurement circuit 13, timings for storing sampled data in primary memory 4 are controlled so that the positions of sampled data on the time base on the screen when each sampled data is stored coincide with each other.

This enables averaging processing that can reject noise without band limitation to be achieved.

In this embodiment, the primary memory and the acquisition memory are shown as independent of each other. However, a physically integrated single memory may be used by functionally dividing it for each purpose.

The present invention is characterized by the fact that the interpolated data and measured data are handled in the same manner by carrying out the interpolating operation when the ratio of the set data length to observation time interval (data length/observation time interval) is larger than the maximum sampling frequency of the A/D converter and writing the data obtained after interpolation into the memory.

This enables automatic measurement of waveform parameters, such as period and time difference, and waveform parameters specified with a cursor to be read with high accuracy and at high resolution.

In addition, intensity modulation can be applied to the displayed waveforms even for high-speed signals as carried out in analog oscilloscopes, by utilizing the interpolated data for waveform display as the frequency information without distinguishing the interpolated data from original sampled data.

Further, the band width for averaging processing can be improved by providing a circuit to measure the time difference between the trigger and the sampling and by handling the waveform data obtained after interpolation by sorting the data in the order based on the triggering instant used as the reference.

As described above, according to the present invention, waveform measuring instruments that can perform signal processing and waveform parameter measurement with high accuracy and at high resolution can be provided, and thus the present invention is suitable for various types of waveform measuring instruments including digital oscilloscopes.

What is claimed is:

1. A waveform measuring instrument configured to write measured signal waveforms into a memory after converting the waveforms to digital data, wherein an interpolation system for performing interpolation between said digital data is provided and the data obtained after interpolation are written in said memory, wherein a means for measuring the time difference between a time base signal and a trigger signal is provided and addresses for writing said digital data into said memory are controlled so that said time difference is corrected, wherein a time base clock generates said time base signal as a reference sampling clock signal for said waveform measuring instrument, and wherein said trigger signal is a signal showing a standard in time of the measurement wave pattern signal side that a trigger circuit occurs.

2. A waveform measuring instrument in accordance with claim 1, wherein said data written in said memory are read and subjected to signal processing.

3. A waveform measuring instrument in accordance with claim 2, wherein said data written in said memory are read and subjected to averaging.

4. A waveform measuring instrument in accordance with claim 2, wherein calculation among two or more waveforms is operated based on said data obtained after interpolation written in said memory.

5. A waveform measuring instrument in accordance with claim 1, wherein automatic measurement of waveform parameters is performed based on said data obtained after interpolation written in said memory.

6. A waveform measuring instrument in accordance with claim 1, wherein reading of waveform data specified with a cursor is carried out based on said data obtained after interpolation written in said memory.

7. A waveform measuring instrument in accordance with claim 1, wherein waveform display processing is carried out based on said data obtained after interpolation written in said memory.

8. A waveform measuring instrument in accordance with claim 7, wherein data appearance frequencies are determined based on said data obtained after interpolation written in said memory and intensity modulated displaying corresponding to said appearance frequencies is performed.

* * * * *